(12) United States Patent
Leu

(10) Patent No.: US 6,691,697 B2
(45) Date of Patent: Feb. 17, 2004

(54) METHOD FOR CUTTING THIN FILM FILTER WORK PIECES

(75) Inventor: Charles Leu, Fremont, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/138,003

(22) Filed: May 3, 2002

(65) Prior Publication Data

US 2003/0205221 A1 Nov. 6, 2003

(51) Int. Cl.[7] ............................................. B28D 7/04
(52) U.S. Cl. .................................. 125/35; 451/364
(58) Field of Search ............................ 125/12, 13.01, 125/20, 35; 451/364, 57; 269/21, 288, 290, 291

(56) References Cited

U.S. PATENT DOCUMENTS 5,029,418 A * 7/1991 Bull .......................... 451/41
6,276,355 B1 * 8/2001 Zhang et al. ................ 125/20
6,295,978 B1 * 10/2001 Wark et al. .................. 125/35
6,354,909 B1 * 3/2002 Boucher et al. .............. 451/12

* cited by examiner

Primary Examiner—Dung Van Nguyen
(74) Attorney, Agent, or Firm—Wei Te Chung

(57) ABSTRACT

A method for cutting thin film filter work pieces has two embodiments. In a first embodiment, an intermediate layer (13) binds an augmenting substrate (14) to a glass substrate (12) of the work piece (16) prior to cutting of the work piece. In a second embodiment, the work piece (23) comprises a glass substrate (22) which is thicker than a final desired thickness. After the work piece is cut, a surplus portion (222) of the glass substrate is removed. Both embodiments of the method increase the effective thickness of the work piece, which reduces the residual stress in the final thin film filter product, and reduces the risk of a film stack (11, 21) of the work piece peeling from the glass substrate during the cutting process.

17 Claims, 4 Drawing Sheets

METHOD FOR CUTTING THIN FILM FILTER WORK PIECES

BACKGROUND OF THE INVENTION

1. Field of the Invention

The present invention relates to methods of cutting thin film filter work pieces for optical devices, and more particularly to methods of cutting dense wavelength division multiplexing (DWDM) thin film filter work pieces that reduce their residual stresses and thus reduce their stress-induced peak insertion losses.

2. Description of Prior Art

Thin films are an applications branch of optical and semiconductor science and technology that has had a tremendous impact on social development, especially in the electronic information and optical communications fields. These films can be single layer or multiple layer coated on a substrate. They can also be freestanding components in their own right.

Peak insertion loss is an important criterion for evaluating the quality of a thin film filter. Today more precisely controlled techniques are being developed, which enable more layers of film to be deposited on a given substrate. This enables DWDM thin film filters to meet increasing demands for increased number of cavities and smaller distances between channels. Such techniques include chemical vapor deposition (CVD), ion beam aided deposition (IBAD), Sol-Gel, and vacuum evaporation. Unfortunately, the increased number of film layers necessarily results in more internal stress in a film stack of a DWDM thin film filter, which results in increased peak insertion loss. If the film stack of a DWDM thin film filter work piece already has high internal stresses after formation, it is important that these stresses not be unduly increased as a result of cutting. Indeed, such a film stack is often too brittle to be safely cut. The film stack may be damaged or destroyed during cutting.

The most common method of cutting a DWDM thin film filter work piece is to prepare the work piece so that it comprises a film stack on a glass substrate. The work piece is mounted on a piece of ultraviolet (UV) tape, and the resulting combination tape-work piece is mounted on a dicing machine. The combination tape-work piece is then cut with a diamond blade by the dicing machine to form pieces of desired size.

U.S. Pat. No. 6,295,978 discloses a conventional method for dicing wafers, which could be applied to thin film filter work pieces. Referring to FIGS. 7 and 8, a wafer has a circuit side, an underside and a street index that defines a guide for dicing the wafer into pieces. The method includes providing a chuck having a surface for supporting the underside of the wafer. A plurality of recesses is defined in the upper surface of the chuck, corresponding to the street index of the wafer. When a cutting blade cuts along a street index, the recess beneath the street index saves the blade from unnecessary wear.

The methods mentioned above are well-established for cutting wafers or ordinary thin film filter work pieces having relatively few layers of film. However, modern DWDM thin film filters can have more than 150 layers of film. When the blade of the dicing machine is cutting the work piece, additional stress is induced in the film stack, and this stress is added to the pre-existing internal stresses within the film stack. The stress induced by the blade results in increased residual stress in the film stack. This increases the peak insertion loss of the final product thin film filter, or even distorts the whole optical spectrum of the final product thin film filter. The stress induced by the blade may even destroy the film stack during cutting.

SUMMARY OF THE INVENTION

In view of the above, an object of the present invention is to provide a method for reducing residual stresses in film stacks of diced thin film filter work pieces.

A further object of the present invention is to provide a method for increasing the effective thickness of a thin film filter work piece, thereby increasing the allowable yield stress in the work piece, minimizing addition of cutting-induced stress to residual internal stress in the film stack of diced work pieces, and thereby reducing stress-induced peak insertion loss accountable to cutting of the work piece.

Another object of the present invention is to provide a method for reducing the risk of a film stack peeling from a substrate during cutting of a thin film filter work piece.

To achieve the above objects, a method of cutting thin film filter work pieces in accordance with the present invention is described in two preferred embodiments. In a first embodiment, an intermediate layer is attached between an augmenting substrate and a glass substrate of the work piece prior to cutting of the work piece. In a second embodiment, the work piece comprises a glass substrate which is thicker than a final desired thickness. After the work piece is cut, a surplus part of the glass substrate is removed. Both of the embodiments of the present invented method increase the effective thickness of the work piece, which results in a reduced residual stress in the final product thin film filter, and which reduces the risk of a film stack of the work piece peeling from the glass substrate during the machining process.

Other objects, advantages and novel features of the present invention will become more apparent from the following detailed description when taken in conjunction with the accompanying drawings, in which:

DETAILED DESCRIPTION OF PREFERRED EMBODIMENTS OF THE PRESENT INVENTION

A method of the present invention increases an effective thickness of a thin film filter work piece so that during cutting of the work piece, the cutting stress is applied over a larger surface, decreasing the risk of destroying the film stack of the work piece, and thus reducing the stress-induced peak insertion loss suffered by the product thin film filters as a result of the machining process. Two preferred embodiments of the method of the present invention are disclosed.

Figure 1:
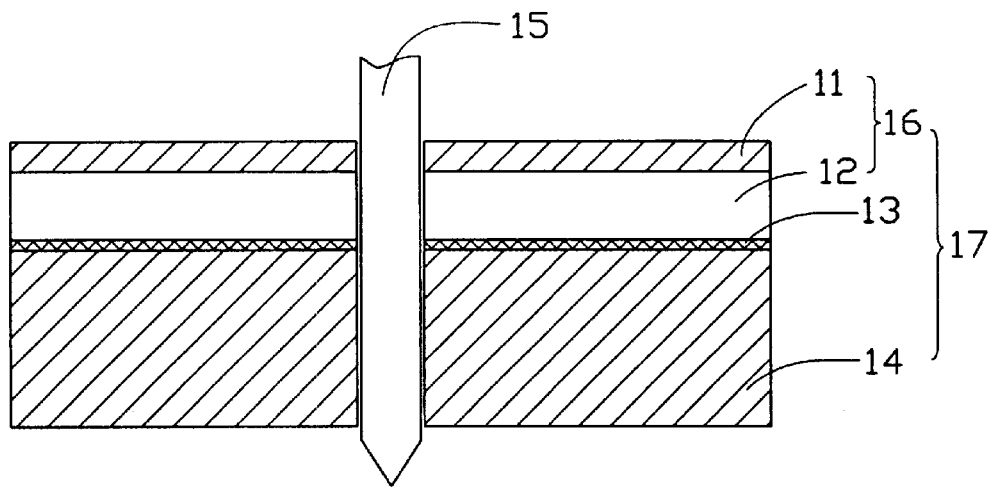
FIG. 1 is a cross-sectional view of an augmented thin film filter work piece in accordance with a first preferred embodiment of the present invention, together with a diamond blade.

Referring to FIG. 1, a first preferred embodiment comprises 7 steps as follows:

(1) Providing an augmenting substrate 14;
(2) Coating an intermediate layer 13 on the augmenting substrate 14;
(3) Mounting a work piece 16 composed of a film stack 11 on a glass substrate 12 onto the intermediate layer 13;
(4) Removing air bubbles from the intermediate layer 13, and making the film stack 11, the glass substrate 12, the intermediate layer 13 and the augmenting substrate 14 substantially parallel;
(5) Allowing the intermediate layer 13 that binds the augmenting substrate 14 to the work piece 16 to harden;
(6) Cutting the combined film stack 11, glass substrate 12, intermediate layer 13 and augmenting substrate 14 into pieces 35; and
(7) Removing intermediate pieces layer 33 and augmenting substrate pieces 34 from each of the cut pieces 35.

In the first step, a heat source (not shown) is used to heat the augmenting substrate 14. In this preferred embodiment, the augmenting substrate 14 is a silicon wafer. The augmenting substrate 14 can also be ceramic, glass or even metal. The augmenting substrate 14 is heated to a temperature between 120 and 150 degrees Centigrade.

In the second step the intermediate layer 13 is applied in a uniform composition and thickness on the heated augmenting substrate 14. In this preferred embodiment, the material of the intermediate layer 13 is Crystalbond™ 509 or 590.

In the third step, the thin film filter work piece 16 comprising the glass substrate 12 and the film stack 11 is mounted on the intermediate layer 13, such that the glass substrate 12 closely abuts the intermediate layer 13. An assembly 17 comprising the augmenting substrate 14, intermediate layer 13 and the work piece 16 should come to the temperature between 120 and 150 degrees Centigrade.

In the fourth step, pressure is applied inward against a top (not labeled) of the work piece 16 and a bottom (not labeled) of the augmenting layer 14 to remove air bubbles from between the augmenting substrate 14, and the work piece 16, and to ensure that the silicon wafer substrate 14 is parallel to the glass substrate 12 and the film stack 11.

In the fifth step, the assembly 17 is removed from the heat source and allowed to cool slowly to room temperature, until the intermediate layer 13 is hardened. The assembly 17 should be at room temperature for 20 to 30 minutes before the processing of the next step. During this step, crystalline bonds are formed between the silicon substrate 14 and the glass substrate 12. The assembly 17 now comprises the film stack 11, the glass substrate 12, the hardened intermediate layer 13, and the silicon substrate 14.

Figure 2:
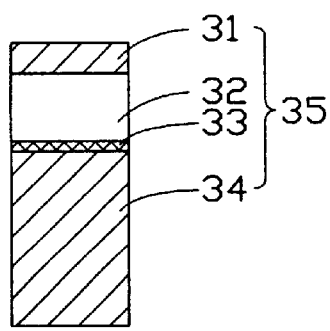
FIG. 2 is a cross-sectional view of a piece of a cut augmented thin film filter work piece of FIG. 1.

Referring to FIG. 2, in the sixth step, the assembly 17 is cut into pieces 35 by a diamond blade 15 of a dicing machine (not shown).

Figure 3:
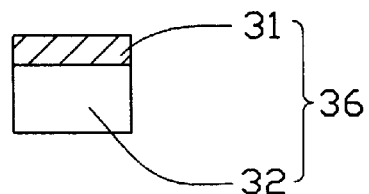
FIG. 3 is a cross-sectional view of a thin film filter precursor prepared from a piece of FIG. 2.

Referring to FIG. 3, in the seventh step, the intermediate layer pieces 33 and the silicon substrate pieces 34 are removed from each piece 35, leaving thin film filter precursors 36 comprising diced pieces of the original thin film filter work piece 16, each precursor 36 having a film stack piece 31 attached to a glass substrate piece 32. Each thin film filter precursor 36 has reduced peak insertion loss compared to similar thin film filter precursors prepared by conventional means.

Although this preferred embodiment uses a silicon wafer as the augmenting substrate 14, the augmenting substrate 14 may alternatively be made of glass, ceramic, or even metal. In addition, resin glue rather than Crystalbond™ 509 or 590 can also be used as the intermediate layer 13, to bind the glass substrate 12 and the augmenting substrate 14 firmly together without forming crystalline bonds. Good results can be obtained when a combined thickness of the augmenting substrate 14, the intermediate layer 13, the glass substrate 12 and the film stack 11 is more than 4 mm.

Figure 4:
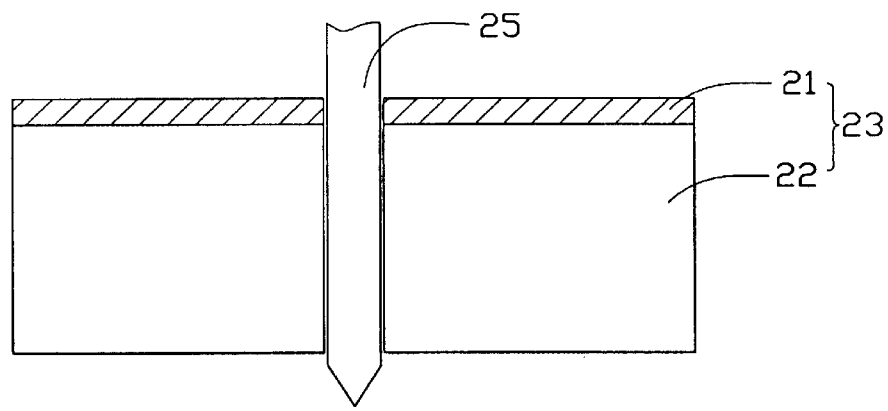
FIG. 4 is a cross-sectional view of a thin film filter work piece in accordance with a second preferred embodiment of the present invention, together with a diamond blade.
Figure 5:
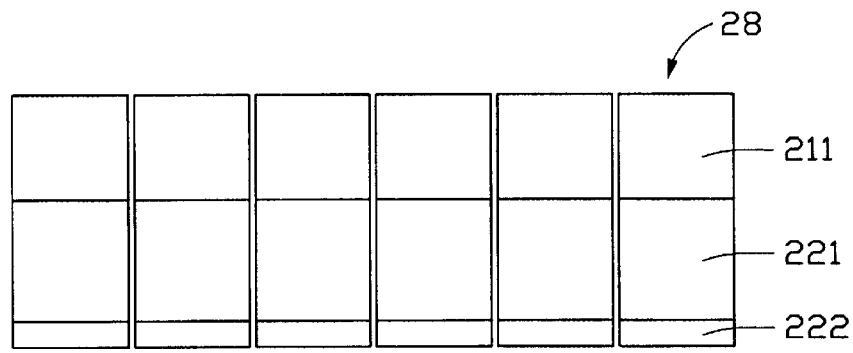
FIG. 5 is a cross-sectional view of the thin film filter work piece of FIG. 4 in its cut state.
Figure 6:
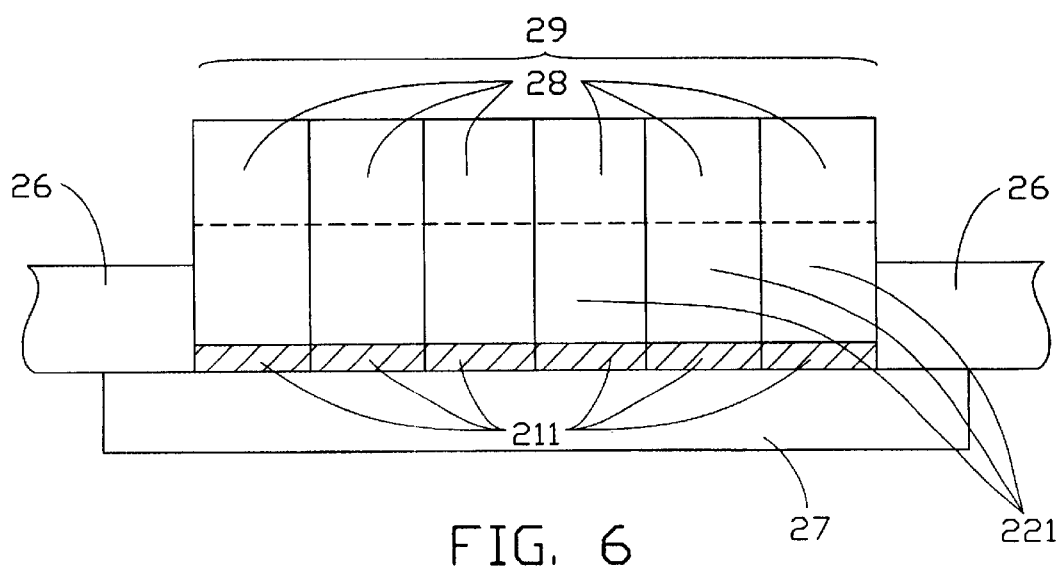
FIG. 6 is a cross-sectional view of the newly cut thin film filter work piece of FIG. 5, pressed together and associated equipment.
Figure 7:
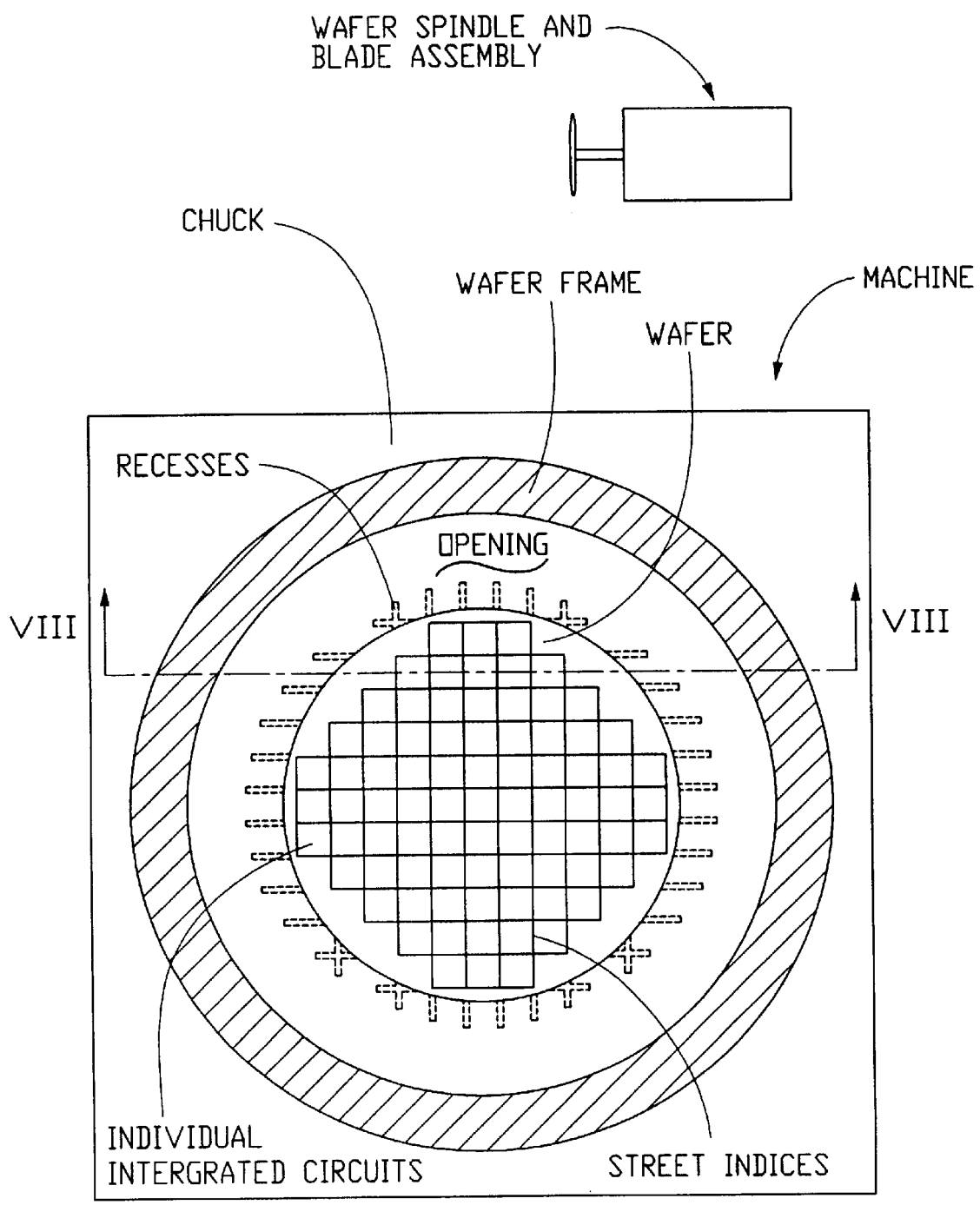
FIG. 7 is a top plan view of a wafer on a wafer dicing machine for cutting in accordance with a conventional method for cutting wafer pieces.
Figure 8:
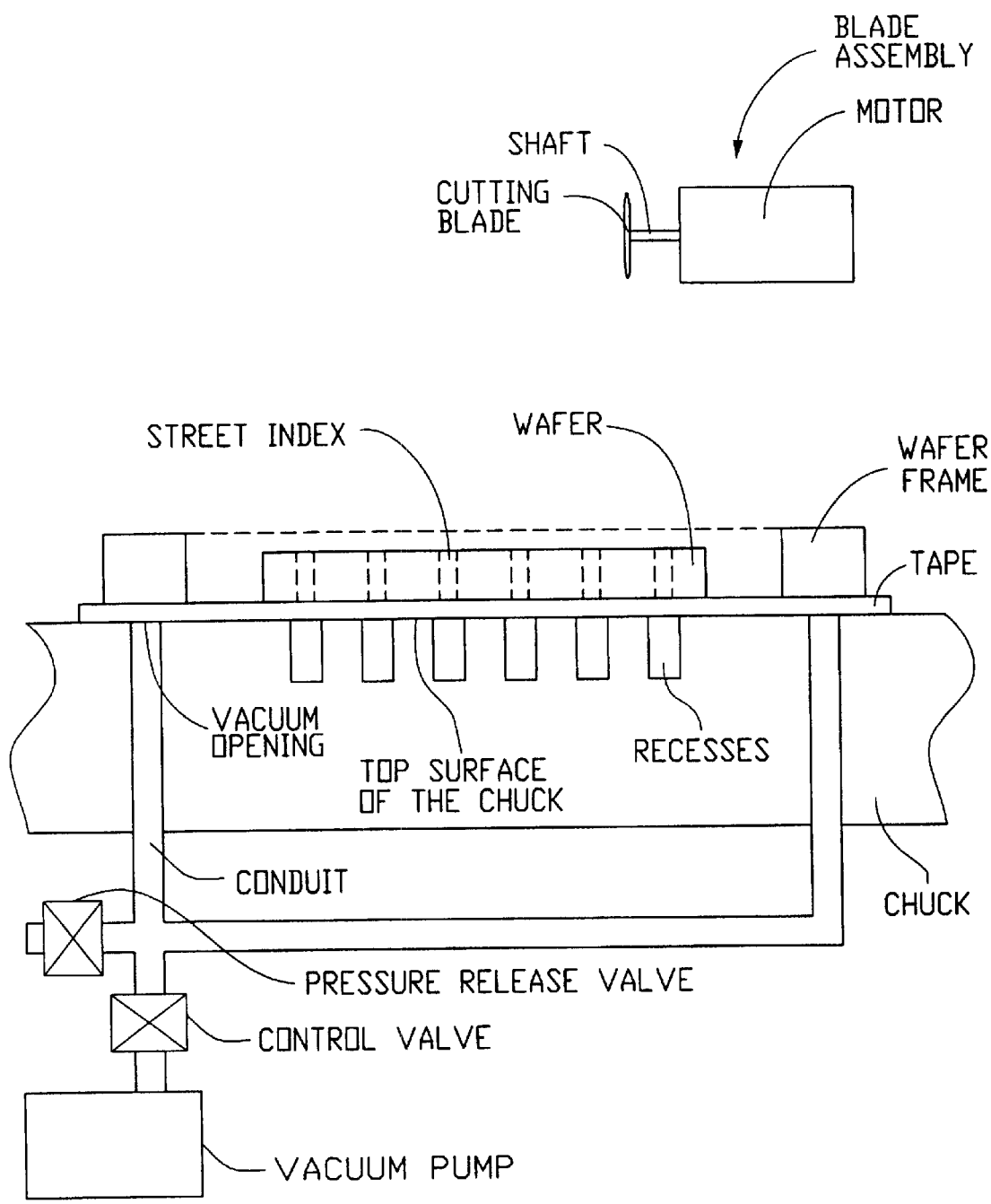
FIG. 8 is a cross-sectional view of the wafer of FIG. 7 on the wafer dicing machine of FIG. 7, taken along line VIII—VIII of FIG. 7.

Referring to FIGS. 4 to 6, a second embodiment of the method for cutting thin film filter work pieces comprises five steps as follows:

(1) Providing a thin film filter work piece 23 comprising a thin film stack 21 attached to a glass substrate 22, the glass substrate 22 being thicker than a final desired thickness;
(2) Cutting the work piece 23 into pieces 28 with a diamond blade 25 using a dicing machine (not shown);
(3) Compressing the cut pieces 28 as a plate 29, each piece 28 holding a same relative position to one another as in the uncut work piece 23;
(4) Using a chuck 26 and a support 27 to fix the plate 29 in place; and
(5) Removing surplus portions 222 of the glass substrate 22.

Referring to FIG. 4, in the second embodiment, the thin film filter work piece 23 comprises the thick glass substrate 22 and the film stack 21. The thick glass substrate 22 increases the effective thickness of the thin film filter work piece 23. A combined thickness of the glass substrate 22 and the film stack 21 is more than 4 mm.

In the second step, each piece 28 (see FIG. 5) comprises a film stack piece 211, a desired portion of the substrate 221, and a surplus portion of the substrate 222.

In the third step, the pieces 28 are pushed together into the plate 29 so that they hold their same relative positions to one another as they had in the original work piece 23.

In the fourth step, referring particularly to FIG. 6, the plate 29 is clamped upside-down in the chuck 26, and is supported on the support 27.

In the fifth step, the surplus portion of the substrate 222 are removed from the cut pieces 28 using conventional means, such as polishing or etching to leave thin film filter precursors (not shown) having a reduced peak insertion loss comparing to thin film filter precursors prepared by conventional means.

The two above described preferred embodiments can also be adapted for cutting a thin film filter workpiece comprising a first glass substrate, a second glass substrate, and a film stack between the first and second glass substrates.

Other modifications and adaptations of the above-described preferred method embodiments of the present invention may be made to meet particular requirements. This disclosure is intended to exemplify the invention without limiting its scope. All modifications that incorporate the invention disclosed in the preferred embodiment are to be construed as coming within the scope of the appended claims or the range of equivalents to which the claims are entitled.

I claim:

1. A method for cutting a thin film filter work piece, the work piece comprising a glass substrate and a film stack, the method comprising the steps of:
   providing an augmenting substrate;
   coating an intermediate layer on a top surface of the augmenting substrate;
   mounting the work piece onto the intermediate layer;
   removing air bubbles from the intermediate layer, and making the film stack, glass substrate, intermediate layer and augmenting substrate substantially parallel;
   allowing the intermediate layer that binds the augmenting substrate to the work piece to harden;
   cutting the combined film stack, glass substrate, intermediate layer and augmenting substrate into pieces; and
   removing an intermediate layer piece and an augmenting substrate piece from each of the cut pieces.

2. The method as described in claim 1, wherein the work piece comprises a first glass substrate, a second glass substrate, and a film stack between the first and second glass substrates.

3. The method as described in claim 1, wherein the substrate is made of one of the following silicon wafer, ceramic, glass, or metal.

4. The method as described in claim 1, wherein the augmenting substrate is heated to a temperature between 120 and 150 degrees Centigrade before the intermediate layer coating is applied to the augmenting substrate.

5. The method as described in claim 1, wherein the intermediate layer is Crystalbond™ 509 or 590 for binding the glass substrate and the augmenting substrate firmly together.

6. The method as described in claim 1, wherein the intermediate layer is resin glue.

7. The method as described in claim 1, wherein the film stack, glass substrate, intermediate layer and augmenting substrate are substantially parallel after the intermediate layer has hardened.

8. The method as described in claim 1, wherein a combined thickness of the augmenting substrate, the intermediate layer, the glass substrate and the film stack is more than 4 millimeters.

9. A method for cutting a thin film filter work piece, the work piece comprising a glass substrate and a film stack, the method comprising the steps of:
   providing the work piece such that its glass substrate is thicker than a final desired thickness;
   cutting the work piece into pieces, each piece having a film stack piece and a glass substrate piece;
   pushing the cut pieces together into a plate so that the cut pieces hold their same relative positions to one another as they had in the original, uncut work piece;
   clamping the plate in a chuck and supporting the plate upside-down on a support; and
   removing a surplus portion of each glass substrate piece from each cut piece.

10. The method as described in claim 9, wherein a thickness of the work piece is more than 4 millimeters.

11. The method as described in claim 9, wherein, after the plate has been clamped in the chuck and supported on the support, top and bottom surfaces of each piece are substantially parallel.

12. The method as described in claim 9, wherein the work piece comprises a first glass substrate, a second glass substrate, and a film stack between the first and second substrates.

13. The method as described in claim 9, wherein the work piece is cut into pieces with a diamond blade by a dicing machine.

14. The method as described in claim 9, wherein the surplus portions of the glass substrate pieces are removed by polishing or etching.

15. A method for making a thin film filter piece with reduced stress-induced peak insertion loss, comprising the steps of:
   providing a glass substrate with a film stack applied thereon, said glass substrate defining a thickness which is larger than a desired one of a final finished film filter piece for use;
   cutting said glass substrate with the associated film stack thereon into pieces each with desired planar dimensions; and
   removing a portion of said glass substrate of each of said pieces opposite to said film stack so as to obtain said desired thickness thereof.

16. The method as described in claim 15, wherein said removed portion of the glass substrate is an original integral part of said glass substrate when said glass substrate is initially formed.

17. The method as described in claim 15, wherein said removed portion of the glass substrate is not an original integral part of said glass substrate when said glass substrate is initially formed, but instead includes augmenting substrate which is fastened to said glass substrate via an intermediate layer after said glass substrate is initially formed itself.

* * * * *